United States Patent [19]

Kasper et al.

[11] Patent Number: 5,740,191
[45] Date of Patent: Apr. 14, 1998

[54] WIDE TEMPERATURE RANGE UNCOOLED LIGHTWAVE TRANSMITTER HAVING A HEATED LASER

[75] Inventors: Bryon Lynn Kasper, Allentown; Fridolin Ludwig Bosch, Bethlehem, both of Pa.

[73] Assignee: Lucent Technologies Inc., Murray Hill, N.J.

[21] Appl. No.: 678,438

[22] Filed: Jul. 13, 1996

[51] Int. Cl.$^6$ ..................................................... H01S 3/04
[52] U.S. Cl. ............................................................ 372/34
[58] Field of Search ........................................ 372/34, 35

[56] References Cited

U.S. PATENT DOCUMENTS

| | | | |
|---|---|---|---|
| 5,214,660 | 5/1993 | Masuko et al. | 372/34 |
| 5,602,860 | 2/1997 | Masonson | 372/34 |

*Primary Examiner*—Leon Scott, Jr.

[57] ABSTRACT

A laser transmitter that includes a heating element coupled to the laser package and controlled to allow the laser to be kept at a higher temperature than ambient when low temperature extremes occur, thus limiting the range of wavelengths output by the laser over a given temperature range. The laser transmitter includes a semiconductor laser having an associated operating temperature; a laser driver circuit coupled to the semiconductor laser to control a modulation current and bias current conducted by the semiconductor laser; a heating element thermally coupled to the semiconductor laser; and a heating control circuit that (i) senses a temperature substantially representative of the ambient temperature surrounding the laser transmitter, (ii) energizes the heating element to provide heat to the semiconductor laser only when the temperature substantially representative of the ambient temperature is sensed below a predetermined minimum temperature, and (iii) upon energizing the heating element, controls heating of the heating element based on the temperature substantially representative of the ambient temperature.

25 Claims, 4 Drawing Sheets

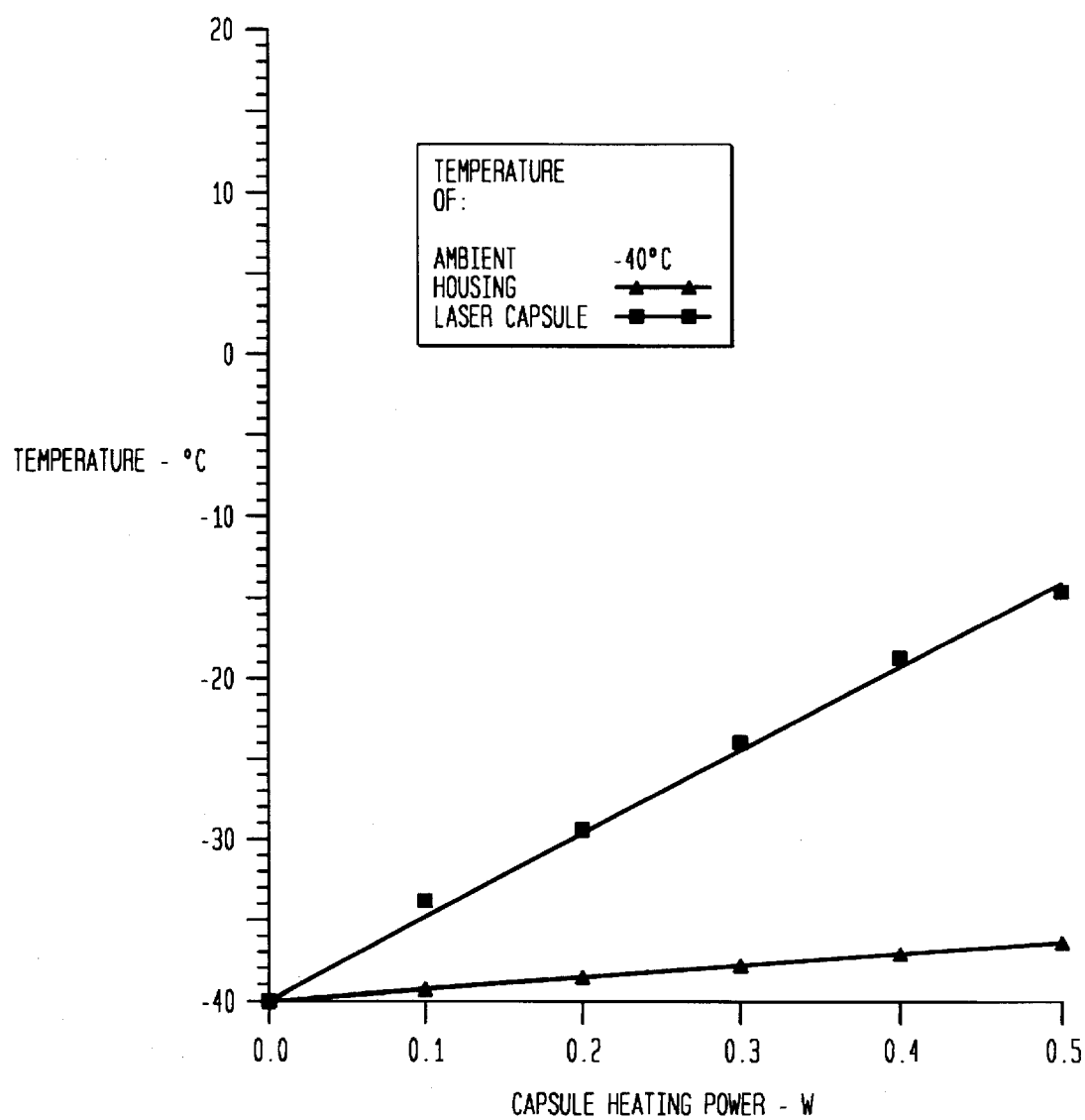

1

WIDE TEMPERATURE RANGE UNCOOLED LIGHTWAVE TRANSMITTER HAVING A HEATED LASER

TECHNICAL FIELD

The present invention relates generally to lightwave transmitters, and more particularly, to an uncooled laser transmitter including a heating element operative at low temperatures.

BACKGROUND OF THE INVENTION

Traditionally, semiconductor lasers used in optical transmitters have been packaged with thermoelectric coolers which are controlled in, and dynamically switched between, a cooling and a heating mode to keep the laser at a constant temperature and thus stabilize its performance characteristics. Recently, however, in order to reduce cost, size, and power dissipation of the optical transmitters, there have been efforts to improve the performance of the laser diodes over a wider temperature range to allow them to be used without thermoelectric coolers. As a result of these efforts, relatively good performance wide temperature range lasers are now available and are used in many uncooled application.

Despite these improvements in wide temperature range performance, some laser parameters still vary too much with temperature, and in many applications such variations, even if known and reproducible, are unacceptable. One of the parameters is wavelength, which varies at a rate of about 0.4 to 0.45 nm/° C. for present multi-quantum well multi-longitudinal mode lasers operating at 1.3 μm wavelength. This variation creates a problem when trying to design a wide-temperature range (–40° C. to +85° C.) transmitter to meet SONET (i.e., Synchronous Optical Network) long reach standards. Under these standards, the allowed transmitter wavelength range is from 1280 to 1335 nm, (i.e., a 55 nm window); however, the laser itself will vary by 50 to 56.3 nm over the 125° C. temperature range. Accordingly, there is less than a 5 nm window available at 25° C., for example, for selection for initial wavelength, which cannot currently be achieved with high yield.

In addition, even if it were possible to achieve high yields with less than a 5 nm 25° C. selection window, various physical phenomena which have deleterious effects on laser performance are manifest or pronounced at low temperatures. The pattern dependent turn-on delay increases significantly at low temperatures and causes additional timing jitter. Mode partitioning in distributed feedback (DFB) lasers, which are designed to operate over a wide temperature range, increases at low temperatures possibly resulting in an excessive dispersion penalty for the system.

It would, therefore, be highly advantageous to provide a laser transmitter having a larger wavelength selection window and reduced low temperature effects, and which is not limited by the power, size, cost and other prior art limitations such as those associated with temperature control by thermoelectric cooling.

SUMMARY OF THE INVENTION

The present invention overcomes the above, and other, limitations by providing a laser transmitter that includes a heating element coupled to the laser package and controlled to allow the laser to be kept at a higher temperature than ambient when low temperature extremes occur. More particularly, the laser transmitter includes a semiconductor laser having an associated operating temperature; a laser driver circuit coupled to said semiconductor laser to control a modulation current and bias current conducted by said semiconductor laser; a heating element thermally coupled to said semiconductor laser; and a heating control circuit that (i) senses a substantially representative of an ambient temperature of an environment surrounding the laser transmitter, (ii) energizes said heating element to provide heat to said semiconductor laser only when said temperature substantially representative of the ambient temperature is sensed below a predetermined minimum temperature, and (iii) upon energizing the heating element, controls heating of said heating element based on said temperature substantially representative of the ambient temperature.

In an embodiment of the present invention, the laser transmitter includes a semiconductor laser mounted in a laser capsule which in turn is part of a laser package mounted to a transmitter housing. A laser driver circuit that controls a modulation current and bias current conducted by the laser is mounted in the housing, and a resistive heating element is mounted on the laser capsule. A heating control circuit is also mounted to the housing and senses a temperature of the transmitter housing which varies with the ambient temperature. The heating control circuit activates current conduction through the resistive heating element only when the temperature sensed is below a predetermined minimum temperature.

BRIEF DESCRIPTION OF THE DRAWINGS

The invention will be described in greater detail below by way of reference to the accompanying drawings, wherein:

FIG. 3 plots experimental results for a laser transmitter fabricated according to FIGS. 1A–B, and particularly illustrates the effect of the heating power dissipated by a heating element on the semiconductor laser capsule temperature and on the housing temperature sensed by a temperature sensor with the laser transmitter inserted in a temperature chamber in which the ambient temperature was maintained at –40° C.;

DETAILED DESCRIPTION OF THE PREFERRED EMBODIMENT

Figure 1A:
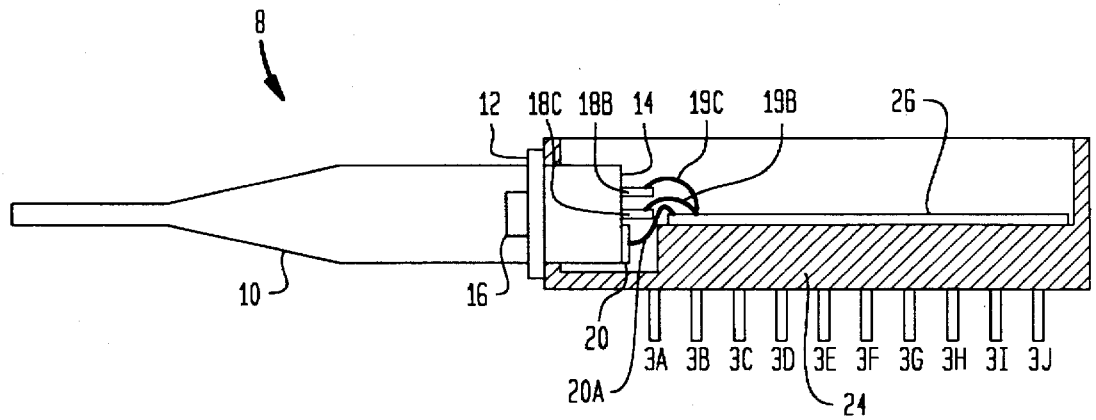
FIG. 1A shows a cross-sectional, side view of a laser transmitter, in accordance with the present invention.
Figure 1B:
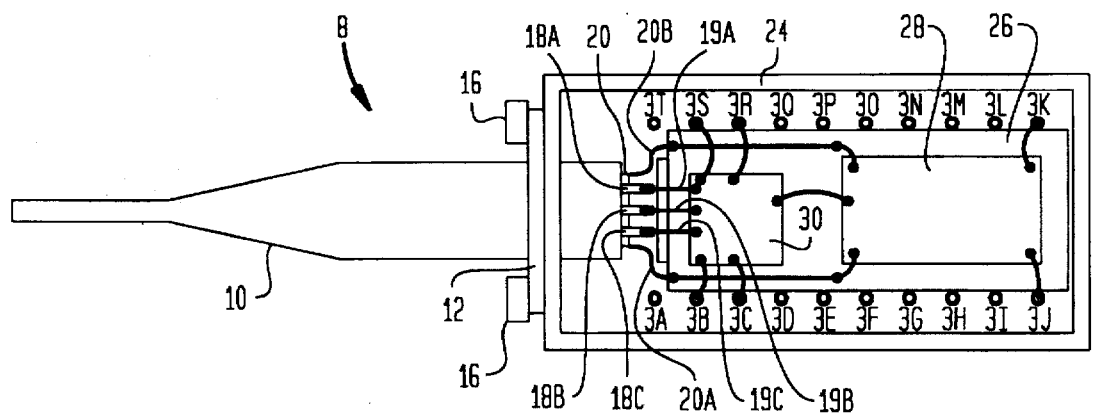
FIG. 1B shows a top view of the laser transmitter depicted in FIG. 1A, in accordance with the present invention.

Referring to FIG. 1A and FIG. 1B, there is shown a side view and a top view, respectively, of a laser transmitter, in accordance with the present invention. Cylindrically packaged laser module 8 includes an optical fiber pig-tail 10 coupled to a laser capsule 14 inside of which a laser source (not shown) is mounted and wire bonded to terminals 18A, 18B, 18C of capsule 14. More particularly, optical fiber pig-tail 10 is affixed to capsule 14 to provide low loss optical coupling of the optical signal generated by the laser into optical fiber pig-tail 10. Capsule 14 has a flange 12 which is adapted for mounting onto housing 24 using screws 16.

Housing 24 is a 20 pin package in which a hybrid substrate 26 is mounted. A laser driver circuit 30 (e.g., a chip) and a heater control circuit 28 (e.g., a chip) are mounted on hybrid substrate 26, and selected ones of pins 3A, 3B . . . 3T are wire bonded to pad terminals of laser driver circuit 30 and heater control circuit 28 as necessary for conducting power, data, and other electrical signals to or from laser driver circuit 30 and heater control circuit 28.

A heating element 20 is mounted on and in thermal contact with, laser capsule 14 and includes terminals which are wire bonded to electrical conductors on hybrid substrate 26, and the electrical conductors are connected to heating control circuit 28. The laser mounted in the laser capsule 14 is coupled to laser driver circuit 30 via terminals 18A, 18B, 18C and wire bonds 19A, 19B, and 19C.

Figure 2:
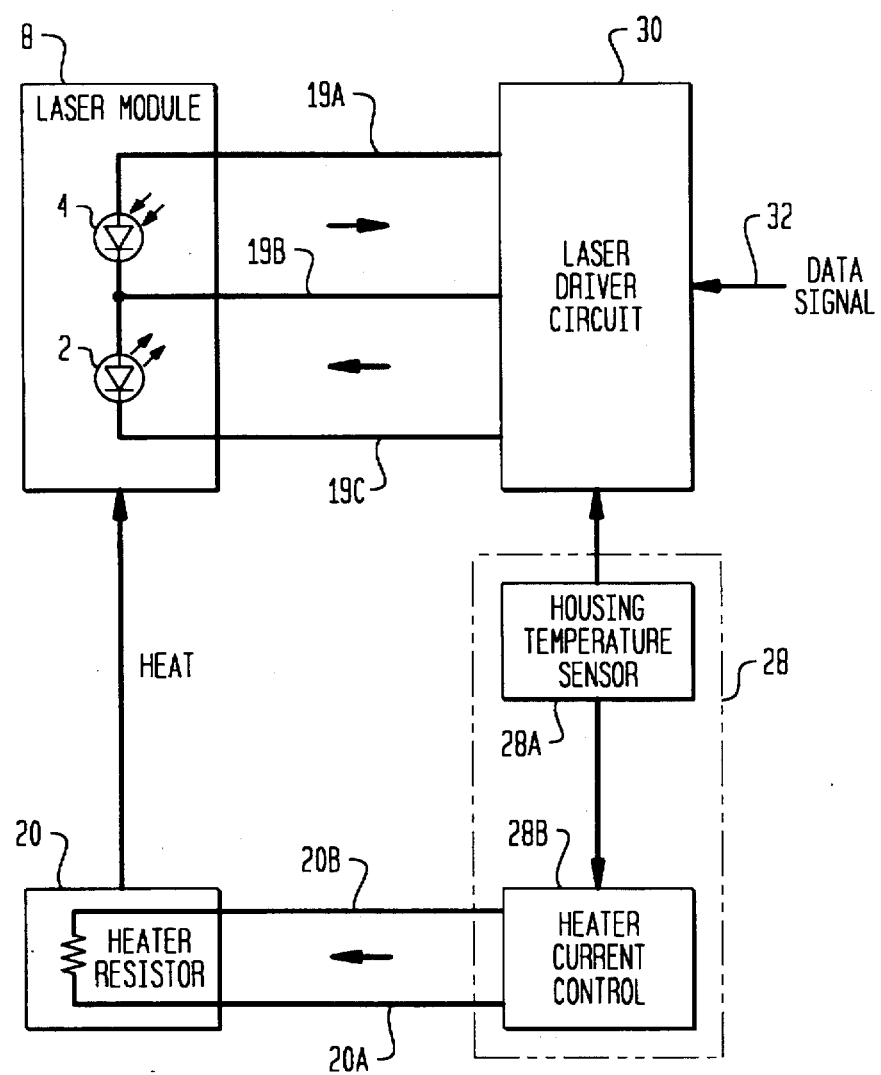
FIG. 2 is a functional block diagram of a laser transmitter, such as that depicted in FIGS. 1A–B, in accordance with the present invention.

For purposes of clarity of exposition of the operational as well as further structural and design characteristices of a laser transmitter according to the present invention, in FIG. 2 there is shown a functional block diagram of a laser transmitter, such as that depicted in FIGS. 1A–C. Laser module 8 includes a semiconductor laser 2, which is typically an InGaAs/InAlAs multiple quantum well multi-longitudinal mode or DFB laser operating at a nominal wavelength of 1.3 μm. Laser module 8 also includes an integrated photodetector 4 for monitoring the laser output power. Heating element 20, shown as a resistor, is in thermal contact with laser module 8, and provides heating power to semiconductor laser 2 under control of a heater current control circuit 28B.

Laser driver circuit 30 modulates current to semiconductor laser 2 according to the data signal bit pattern input on line 32. Laser driver circuit 30 also controls the bias and modulation current level based on the feedback signal received from photodetector 4, and on the temperature signal received from a temperature sensor 28A.

Heater control circuit 28 includes housing temperature sensor 28A and heater current control circuit 28B. Housing temperature sensor 28A is provided, for example, by a temperature measuring circuit which measures the on-chip temperature of heater control circuit 28. A signal representative of the temperature measured by housing temperature sensor circuit 28A is provided to both heater current control circuit 28B and laser driver circuit 30.

For the embodiment of FIG. 1A and 1B, the on-chip temperature measured by the temperature sensor 28A is approximately equal to the temperature of housing 24 of the laser transmitter, and is a function of several parameters, including: (i) the ambient temperature of the laser transmitter, (ii) the power dissipated by the heating element 20 and conducted through the housing to the temperature sensor 28A, and (iii) the power dissipated by the heater current control circuit 28B and the temperature sensor 28A.

FIG. 3 plots experimental results illustrating the effect of the heating power dissipated by heating element 20 on the laser capsule temperature and on the temperature sensed by temperature sensor 28A ("the housing temperature") with the laser transmitter inserted in a temperature chamber in which the ambient temperature was maintained at −40° C. It can be seen that for zero heating power, the laser temperature equals the housing temperature which equals the ambient temperature (i.e., −40° C.). As the heating power is increased from zero to 0.5 Watts (W), the laser temperature increases approximately linearly to about −14° C., while the measured housing temperature increases approximately linearly to about −36° C. The increase in the housing temperature can be attributed to both thermal conduction from the heating element, and thermal conduction from the power dissipation of the heating circuitry.

It is also noted that for a laser transmitter constructed according to the embodiment shown in FIGS. 1A and 1B, for no heating current being supplied to the resistive heating element, it has been experimentally confirmed over the temperature range of −40° C. to 85° C. (not shown) that the housing temperature equals, within about 1° C., the laser capsule temperature.

Accordingly, for the laser transmitter constructed according to the embodiment shown in FIGS. 1A and 1B, the on-chip temperature measured by temperature sensor 28A is essentially equal to the ambient temperature, regardless of whether heating element 20 is being supplied with current via heater current control circuit 28B. Further, when no heating power is supplied, the housing temperature is approximately equal to the laser temperature; when heating power is supplied, the housing temperature is indicative of the semiconductor laser temperature, since for a known heating power and measured housing temperature there corresponds a particular laser temperature.

In accordance with the present invention, heater control circuit 28 controls the heating current to heating element 20 in order to increase the temperature of the laser capsule 14 when low temperature extremes occur. In the embodiment of FIGS. 1A and 1B, this control is effected by heater control circuit 28 activating (i.e. turning on) the heating current only when an ambient temperature below a predetermined minimum temperature is detected by temperature sensor 28A. The control can operate either in an on-off mode (i.e., fully on whenever below a particular temperature set point, fully off otherwise) or turned on gradually (linearly or non-linearly, or via pulse-width modulation, etc.) as temperature decreases below the predetermined minimum.

Figure 4C:
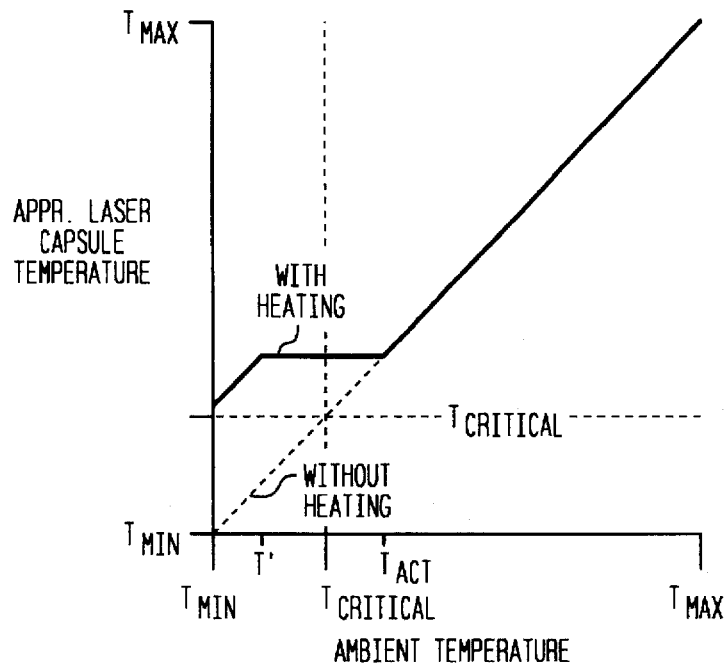
FIG. 4C illustrates the variation of laser temperature as a function of ambient temperature for a laser transmitter controlled by the heating power profile of FIG. 4A, in accordance with the present invention.
Figure 4B:
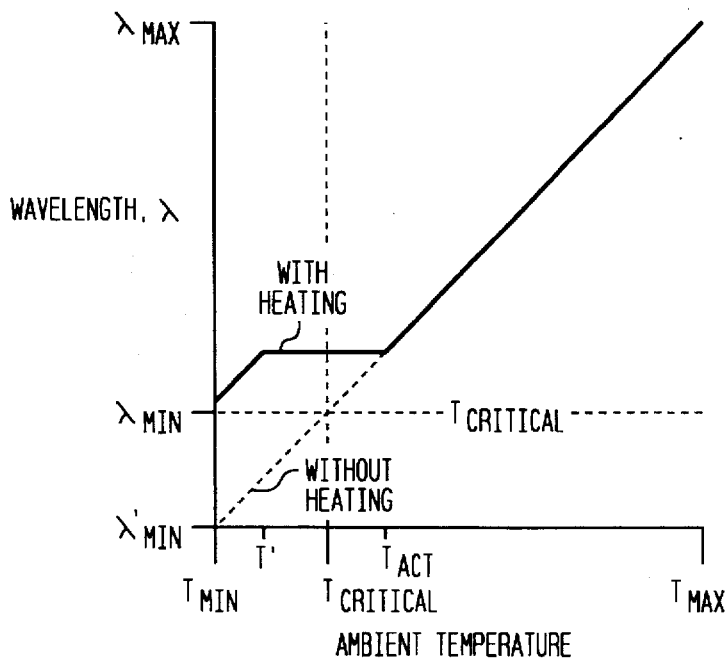
FIG. 4B illustrates the variation of laser output wavelength as a function of ambient temperature for a laser transmitter controlled by the heating power profile of FIG. 4A, in accordance with the present invention.
Figure 4A:
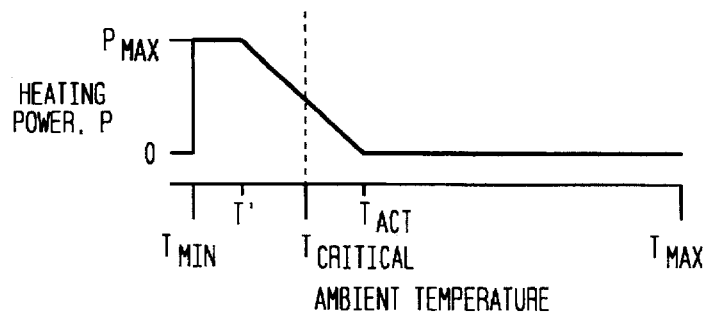
FIG. 4A illustrates a heating power profile provided by a heater current control circuit for a laser transmitter, in accordance with the present invention.

The operation principle of the heater control circuit 28 is illustrated in FIG. 4A, FIG. 4B, and FIG. 4C, which illustrate the relationship among the heating power, the semiconductor laser wavelength, and the associated approximate laser temperature relative to the ambient temperature. In FIGS. 4A–4C, $T_{min}$ and $T_{max}$ represent the minimum and maximum temperature, respectively, which may be specified according to some requirement (e.g., wherein $T_{min}$=−40° C. and $T_{max}$=+85° C.). $T_{critical}$ represents the temperature above which it is desired to maintain laser capsule 14 when the ambient temperature sensed by temperature sensor 28B reaches minimum specified temperature $T_{min}$. In particular, temperature $T_{critical}$ is defined according to the desired minimum wavelength $\lambda_{min}$ to be reached when the sensed temperature corresponds to an ambient temperature of $T_{min}$. Stated alternatively, when the temperature sensed by temperature sensor 28B corresponds to an ambient temperature $T_{min}$, then the laser output wavelength should not be below $\lambda_{min}$ which requires that the temperature of laser capsule 14 not be below $T_{critical}$.

More specifically, FIG. 4A illustrates a heating power profile provided by heater current control circuit 28A as a function of the housing temperature sensed by temperature sensor 28B, which, for clarity of exposition, is assumed to be essentially equal to the ambient temperature regardless of whether heating power is being supplied. As long as the ambient temperature sensed by temperature sensor 28B is above $T_{act}$, no power is supplied to heating element 20 by the heater current control circuit 28A. As shown by FIGS. 4B and 4C, over this temperature range, the approximate laser temperature and, concomitantly, the corresponding laser output wavelength decreases as the ambient temperature decreases.

Once temperature sensor 28A measures a temperature indicative of the ambient temperature decreasing to a value of about $T_{act}$, heater current control circuit 28B begins to supply heating power to heating element 20. As the sensed temperature further decreases below $T_{act}$, heater current control circuit 28B supplies an approximately linearly increasing power level to heating element 20, up to a maximum power level of $P_{max}$ achieved at a given temperature T'. As shown by FIGS. 4B and 4C, over this temperature range, the approximate laser temperature and, concomitantly, the corresponding laser output wavelength decreases (solid lines) are maintained at values above that which would have occurred (i.e., dashed lines) if no heating were supplied. In this particular embodiment, the heating power control profile represented by FIG. 4A results in an approximately constant laser temperature and corresponding laser wavelength in this temperature interval. Notably, if no heating power were supplied (i.e., dashed lines in FIGS. 4B–C), the minimum desired wavelength $\lambda_{min}$ would be output at temperature $T_{critical}$ within this temperature interval.

As temperature sensor 28A senses a temperature indicative of the ambient temperature decreasing below T', heater current control circuit 28B maintains a constant maximum output power supply $P_{max}$ to heating element 20. Accordingly, in this temperature range, the approximate laser temperature and corresponding laser wavelength decrease approximately linearly. At specified minimum temperature $T_{min}$, the laser temperature is at or above $T_{critical}$ and thus, the laser output wavelength is at a wavelength greater than $\lambda_{min}$. By way of comparison, without heating (i.e., dashed lines) of the laser at an ambient temperature of $T_{min}$ the laser temperature would also be about $T_{min}$ and the corresponding laser output wavelength would be $\lambda'_{min}$ which is below the $\lambda_{min}$.

It may be understood, therefore, that by providing heating power to the laser source only when the ambient temperature decreases below a predetermined temperature, the laser temperature is maintained above the ambient temperature for such low ambient temperatures such that at an arbitrary specified minimum ambient temperature, the laser wavelength is assured of being increased by a predetermined amount compared to the laser wavelength if no heating were present. Accordingly, it is understood that as the ambient temperature spans the specified range between $T_{min}$ and $T_{max}$, the laser output wavelength spans a range between $\lambda_{min}$ and $\lambda_{max}$ which is less than the range between $\lambda'_{min}$ and $\lambda_{max}$, thus increasing the temperature operating range and/or the yield window for fabricating laser transmitters to specification.

As described with reference to FIGS. 4A–C, and in accordance with an embodiment of the laser transmitter of FIGS. 1A–1B, and functionally depicted in FIG. 2, the heating power is controlled in an open-loop according to the on-chip temperature measured by heater control circuit 28 which is mounted in the housing (the temperature measured generally described as the housing temperature). Such control is preferably designed based on a calibration procedure for establishing an appropriate heating power control profile for heater control circuit 28. This calibration procedure preferably involves first mapping the relationship among actual measured ambient temperature, temperature sensed by temperature sensor 28A, heating power provided by heater current control circuit 28B, and laser wavelength (which corresponds to laser temperature) measured by a spectrophotometer. Based on this mapping, the heater current control power/housing is designed to supply the appropriate heating current as a function of housing temperature.

It may also be understood that since the calibration procedure provides a known and reproducible relationship between the housing temperature and the laser capsule temperature as a function of the heating power and ambient temperature, control can be implemented, if desired, in an quasi-closed loop based on apparent feedback from the measured housing temperature and the heating power.

Accordingly, it is understood from the foregoing that in order to maintain the semiconductor laser temperature above the ambient temperature when the ambient temperature decreases below a predetermined minimum, the heating control circuit can sense any temperature that indicates that the semiconductor laser temperature is, or would be, at a temperature below the predetermined minimum. That is, the heating control circuit can sense the ambient temperature independently of any on-chip and/or heating element power dissipation effects (e.g., using a thermally isolated temperature sensor to measure the ambient temperature alone). Such sensing of the ambient temperature alone is indicative of the laser temperature since the ambient temperature directly represents the temperature of the laser when no heating power is applied, and, when heating power is supplied, the ambient temperature represents the temperature that would be achieved by the laser if the heating power were removed. Further, a given ambient temperature and a given heating power correspond to a given laser temperature. Thus, sensing the ambient temperature may be said to be indicative of the laser temperature.

Alternatively, in another variation, the heating control circuit can sense the housing temperature which may be a function of both the heating power (and other on-chip power dissipation) and the ambient temperature, and heating power may be activated (i.e., triggered) only when the housing temperature is at or below a predetermined minimum temperature, and the heating power level controlled according to power delivery based on either a pure open-loop or quasi-closed loop control based on mapping the relation among all the temperature and heating variables.

In any such variations described above (or similar variations), it is understood that the temperature sensed by the heating control circuit is indicative of the semiconductor laser temperature, and the heating control circuit (i) activates the heating power when the sensed temperature is at or below a predetermined minimum temperature, and (ii) controls the heating power level, in order to maintain the semiconductor laser at a temperature above the ambient temperature, or otherwise limit the minimum temperature (and thus wavelength) of the semiconductor laser. Preferably, the heating power is controlled to maintain a constant laser temperature over a range of measured ambient temperatures below the predetermined minimum temperature.

It is understood that the laser transmitter according to the present invention provides many features, advantages, and attendant advantages. By effectively reducing the temperature range over which the laser actually varies, the laser transmitter according to the present invention increases the initial wavelength window. For example, for a typical semiconductor laser having a 0.4 nm/° C. wavelength temperature coefficent, if the lowest temperature were limited to −20° C. instead of −40° C., the initial wavelength window would be increased by 8 nm which would substantially improve yield, thereby reducing transmitter cost.

It may be appreciated that a heated laser transmitter according to the present invention can be fabricated quite inexpensively and compactly, without substantial manufacturing modification from conventionally manufactured uncooled laser transmitters, and can provide high reliability and relatively modest power dissipation relative to a transmitter using a thermoelectric heater/cooler. Total power dissipation for the laser module does not increase dramatically since extra power dissipation for heating power occurs only at low temperatures at which the laser bias and drive currents are typically reduced. In addition, by limiting the minimum laser operating temperature, the laser transmitter according to the present invention eliminates or otherwise mitigates deleterious low temperature effects associated with, for example, pattern dependent turn-on delay, and mode partitioning.

Although the above description provides many specificities, these enabling details should not be construed as limiting the scope of the invention, and it will be readily understood by those persons skilled in the art that the present invention is susceptible to many modifications, adaptations, and equivalent implementations without departing from this scope.

It may be appreciated that the foregoing embodiment is directed to readily and inexpensively adapting existing laser transmitter technology while providing good performance, and that the present invention may be practiced in accordance with alternative embodiments which weigh considerations of cost and optimized performance in a different manner. For instance, it is understood that instead of mounting a chip resistor to the capsule, integrating the heating element (e.g., using deposited nichrome or ceramic-metallic compositions) with the laser diode may result in reduced power dissipation since the heating power would be more efficiently coupled to the laser diode.

These and other changes can be made without departing from the spirit and the scope of the invention and without diminishing its attendant advantages. It is therefore intended that the present invention is not limited to the disclosed embodiments but should be defined in accordance with the claims which follow.

We claim:

1. A laser transmitter comprising:
   a semiconductor laser having an associated operating temperature;
   a heating element thermally coupled to said semiconductor laser; and
   a heating control circuit that (i) senses a temperature substantially representative of an ambient temperature of an environment surrounding said laser transmitter, (ii) energizes said heating element to provide heat to said semiconductor laser when said temperature substantially representative of said ambient temperature is sensed below a predetermined minimum temperature, and (iii) upon energizing the heating element, controls heating of said heating element based on said temperature substantially representative of said ambient temperature.

2. The laser transmitter according to claim 1, wherein the laser transmitter is independent of a cooling element that is controlled cooperatively with said heating element to control said operating temperature of said semiconductor laser.

3. The laser transmitter according to claim 1, wherein said temperature sensed by said heating control circuit is related to said operating temperature of said semiconductor laser both when said heating element is activated and when said heating element is not activated.

4. The laser transmitter according to claim 3, further comprising a housing, wherein said heating control circuit is mounted in thermal contact with said housing which is substantially in thermal equilibrium with said ambient temperature, and wherein said heating element, when activated, does not substantially increase a temperature of said housing compared to an increase in said operating temperature of said semiconductor laser.

5. The laser transmitter according to claim 3, wherein said temperature sensed by said heating control circuit employs quasi-closed loop control.

6. The laser transmitter according to claim 1, further comprising a capsule in which said semiconductor laser is mounted in thermal contact.

7. The laser transmitter according to claim 1, wherein said semiconductor laser and said heating element are each mounted on a thermally conductive member.

8. The laser transmitter according to claim 1, wherein said semiconductor laser and said heating element are each integrated on a common semiconductor substrate.

9. The laser transmitter according to claim 1, wherein said heating element is a resistive heater, and said heating control circuit controls a current conducted by said resistive heater.

10. The laser transmitter according to claim 1, wherein said heating control circuit includes a temperature sensing circuit to provide said temperature representative of said ambient temperature.

11. The laser transmitter according to claim 1, wherein said heating control circuit employs open loop control.

12. The laser transmitter according to claim 1, wherein said laser driver circuit receives a signal from said heating control circuit that is indicative of said temperature representative of said operating temperature.

13. The laser transmitter according to claim 1, further comprising an optical fiber pigtail coupled to said semiconductor laser to guide light emitted by said semiconductor laser.

14. The laser transmitter according to claim 1, wherein said semiconductor laser is a distributed feedback laser.

15. The laser transmitter according to claim 1, further comprising a laser driver circuit coupled to said semiconductor laser to control a modulation current and a bias current conducted by said semiconductor laser.

16. An optical transmitter comprising:
    a source means for emitting light having a characteristic which varies with temperature of said source means;
    a heating means thermally coupled to said source means; and
    a heating control means for sensing a temperature substantially representative of an ambient temperature of an environment surrounding said optical transmitter and activating said heating means to provide heat to said source means when said temperature sensed is below a predetermined minimum temperature, said heating control means controlling said heating means to limit variation of said characteristic.

17. The optical transmitter according to claim 16, wherein the optical transmitter is independent of a cooling element that is controlled cooperatively with said heating means to control said temperature of said source means.

18. The optical transmitter according to claim 16, wherein said temperature sensed by said heating control means is substantially related to said ambient temperature of said optical transmitter both when said heating means is activated and when said heating means is not activated.

19. The optical transmitter according to claim 16, wherein said temperature sensed by said heating control means is related to said temperature of said source means when said heating means is activated and when said heating means is not activated.

20. The optical transmitter according to claim 16, further comprising a drive means coupled to said source means for controlling light emitted by said source means.

21. A laser transmitter comprising:

a package housing;

a semiconductor laser mounted in a capsule and having an associated operating temperature, said semiconductor laser selectively outputting coherent radiation having a wavelength which monotonically decreases with decreases in said operating temperature;

a heating element thermally coupled to said semiconductor laser; and a heating control circuit mounted in said package housing, and that senses a temperature substantially representative of an ambient temperature of an environment surrounding said laser transmitter and which activates said heating element to provide heat to said semiconductor laser when the temperature measured is below a predetermined minimum temperature, thereby limiting the variation in said wavelength output by said semiconductor laser.

22. The optical transmitter according to claim 21, wherein the laser transmitter is independent of a cooling element that is controlled cooperatively with said heating control circuit to control said temperature of said semiconductor laser.

23. The optical transmitter according to claim 21, wherein said temperature sensed by said heating control circuit is substantially related to the ambient temperature of said laser transmitter both when said resistive heating element is activated and when said resistive heating element is not activated.

24. The optical transmitter according to claim 21, wherein said temperature sensed by said heating control circuit is related to said operating temperature when said resistive heating element is activated and when said resistive heating element is not activated.

25. The optical transmitter according to claim 21, further comprising a laser driver circuit mounted in said package housing and coupled to said semiconductor laser to control a modulation current conducted by the semiconductor laser.

* * * * *